United States Patent [19]

Blitchington

[11] Patent Number: 4,947,335

[45] Date of Patent: Aug. 7, 1990

[54] IDENTIFICATION OF WORKPIECE INFORMATION

[75] Inventor: Frank H. Blitchington, Richmond, Va.

[73] Assignee: AT&T Bell Laboratories, Murray Hill, N.J.

[21] Appl. No.: 243,346

[22] Filed: Sep. 12, 1988

[51] Int. Cl.[5] .......................... G06F 7/00; G06K 7/00
[52] U.S. Cl. ...................................... 364/468; 235/375
[58] Field of Search ................. 364/468, 478, 474.11; 235/375, 384, 385

[56] References Cited

U.S. PATENT DOCUMENTS

| | | | |
|---|---|---|---|
| 4,005,349 | 5/1973 | Brian | 364/200 |
| 4,114,028 | 9/1978 | Baio et al. | 235/474 |
| 4,408,291 | 10/1983 | Gunzberg et al. | 364/900 |
| 4,443,693 | 4/1984 | Berezowski et al. | 235/474 |
| 4,454,413 | 6/1984 | Morton, Jr. | 235/375 |
| 4,584,238 | 4/1986 | Gen et al. | 428/349 |
| 4,621,410 | 11/1986 | Williamson | 364/474.11 |
| 4,639,874 | 1/1987 | Pezaris | 364/478 |
| 4,673,803 | 6/1987 | Zerle et al. | 235/375 |
| 4,682,261 | 7/1987 | Benson et al. | 364/469 |
| 4,700,309 | 10/1987 | Naito et al. | 235/375 |
| 4,760,247 | 7/1988 | Keane et al. | 235/375 |

FOREIGN PATENT DOCUMENTS 8807730 10/1988 Fed. Rep. of Germany ...... 235/385

Primary Examiner—Allen MacDonald
Attorney, Agent, or Firm—Lester H. Birnbaum

[57] ABSTRACT

Disclosed is a method and apparatus for identifying the lot codes of workpieces, such as printed circuit board panels, as they progress down a manufacturing line. At an initial stage of processing, a hole pattern is drilled along one edge of the pieces. The hole pattern includes the lot code number of that piece in binary form. The hole pattern can be addressed by appropriate optical means such as an LED-phototransistor combination or by a video camera as the pieces pass by in order to determine the lot code or other information at any desired point in the processing.

6 Claims, 3 Drawing Sheets

IDENTIFICATION OF WORKPIECE INFORMATION

BACKGROUND OF THE INVENTION

This invention relates to accessing information, such as lot code numbers, from workpieces as they move down a manufacturing line.

In the fabrication of many types of workpieces, it is important to keep track of lots during the manufacturing process, especially when many different types of a general product are manufactured in the same plant. This is typically true, for example, in the fabrication of printed circuit boards having various circuit configurations. In order to ensure that each product receives the appropriate processing, code numbers are assigned to each lot according to the required fabrication sequence for that lot. Identification of these code numbers as the lots travel through the plant not only ensures appropriate processing, but also facilitates inventory control and helps control production schedules.

At the present time, the lot codes typically appear on documentation which accompanies the boards to various plant locations. Such documentation can be easily lost or erroneously switched with other lots. It is, therefore, desirable to include the lot code numbers on the boards themselves. It has been suggested, for example, that chemically resistant markers could be placed on printed circuit boards (see, for example, U.S. Pat. No. 4,584,238). However, it is difficult to provide any single material which will be resistant to all the caustic chemicals and severe processing involved in circuit board fabrication.

It is, therefore, an object of the invention to provide information which is an integral part of the workpieces and a means of accessing that information as the workpieces move down a production line.

SUMMARY OF THE INVENTION

This and other objects are achieved in accordance with the invention which, in one aspect, is a method of fabricating workpieces, including providing numerical information concerning said workpieces as they move along a conveying means. A pattern of holes is drilled in the workpieces such that the pattern comprises a binary form of the numerical information. The information is then optically addressed as the workpieces move along the conveying means. In accordance with another aspect, the invention is apparatus for fabricating workpieces, including providing numerical information concerning said workpieces as they move along a conveying means. The apparatus includes means for drilling a pattern of holes in the workpieces such that the pattern comprises the numerical information in binary form, and means for optically addressing the information as the workpieces move along the conveying means.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
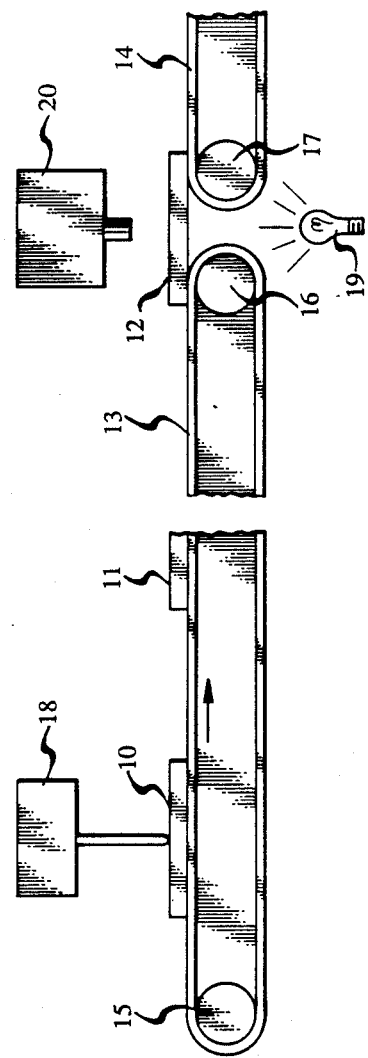
FIG. 1 is a schematic illustration of the fabrication of workpieces in accordance with one embodiment of the invention.

FIG. 1 schematically illustrates a basic form of the invention. Workpieces, such as printed circuit board panels 10, 11 and 12, travel along a conveying means which, in this example, include belts 13 and 14 driven by wheels. Two wheels driving belt 13 are shown as 15 and 16, while only one of the wheels 17, driving belt 14 is visible. At an initial stage in the manufacturing sequence, each workpiece is subjected to a hole drilling apparatus 18 which drills a pattern of holes through the major surfaces of the workpieces. As explained below, the pattern represents numerical information concerning the workpieces, such as the lot code number. The workpieces continue down the conveying means and are subjected to the usual manufacturing operations (not shown) for those workpieces. At one or more points along the line, the numerical information contained in the hole pattern will be accessed for each workpiece. This is accomplished by optical means illustrated by light source 19 and an optical receiver 20. The optical means is usually placed between two wheels of adjacent conveyor belts 13 and 14 to permit optical access to the hole pattern of the workpieces.

Figure 2:
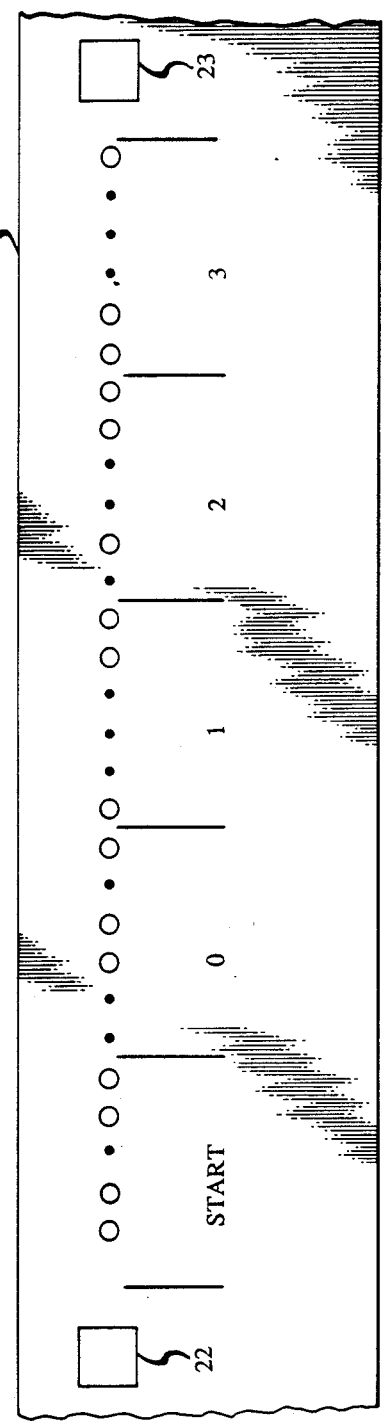
FIG. 2 is an illustration of a hole pattern formed in a workpiece in accordance with an embodiment of the invention.

An example of a possible hole pattern for the workpieces is illustrated in FIG. 2. In this example, it is assumed that the workpieces are standard circuit board panels 21 which measure approximately 18 inches × 24 inches. The hole pattern is drilled along one edge of each panel between two locating holes 22 and 23. The presence of a hole represents a "1", and the absence of a hole represents a "0" so that a digital code is produced by the hole pattern. In the particular code employed, the first four spaces of each slot are weighted 1, 2, 4 and 7, the fifth space is parity, and the sixth is a sync bit as indicated in the following table:

TABLE

|       | 1247PS |
|-------|--------|
| Start | 11011  |
| 0     | 001101 |
| 1     | 100011 |
| 2     | 010011 |
| 3     | 110001 |
| 4     | 001011 |
| 5     | 101001 |
| 6     | 011001 |
| 7     | 000111 |
| 8     | 100101 |
| 9     | 010101 |

In the hole pattern illustrated in FIG. 2, holes are represented by "0", spaces by "." and the slots by the vertical lines. Thus, the first slot indicates the start of the code, and the following slots represent the numerals 0, 1, 2 and 3 to give the lot number of this panel. Of course, other digital codes could be employed if desired. The hole drilling apparatus can be any standard type for drilling holes in printed circuit boards. In this particular example, the apparatus was commercially available from Advanced Controls under the trademark Trudil 97 Autoload.

Figure 3:
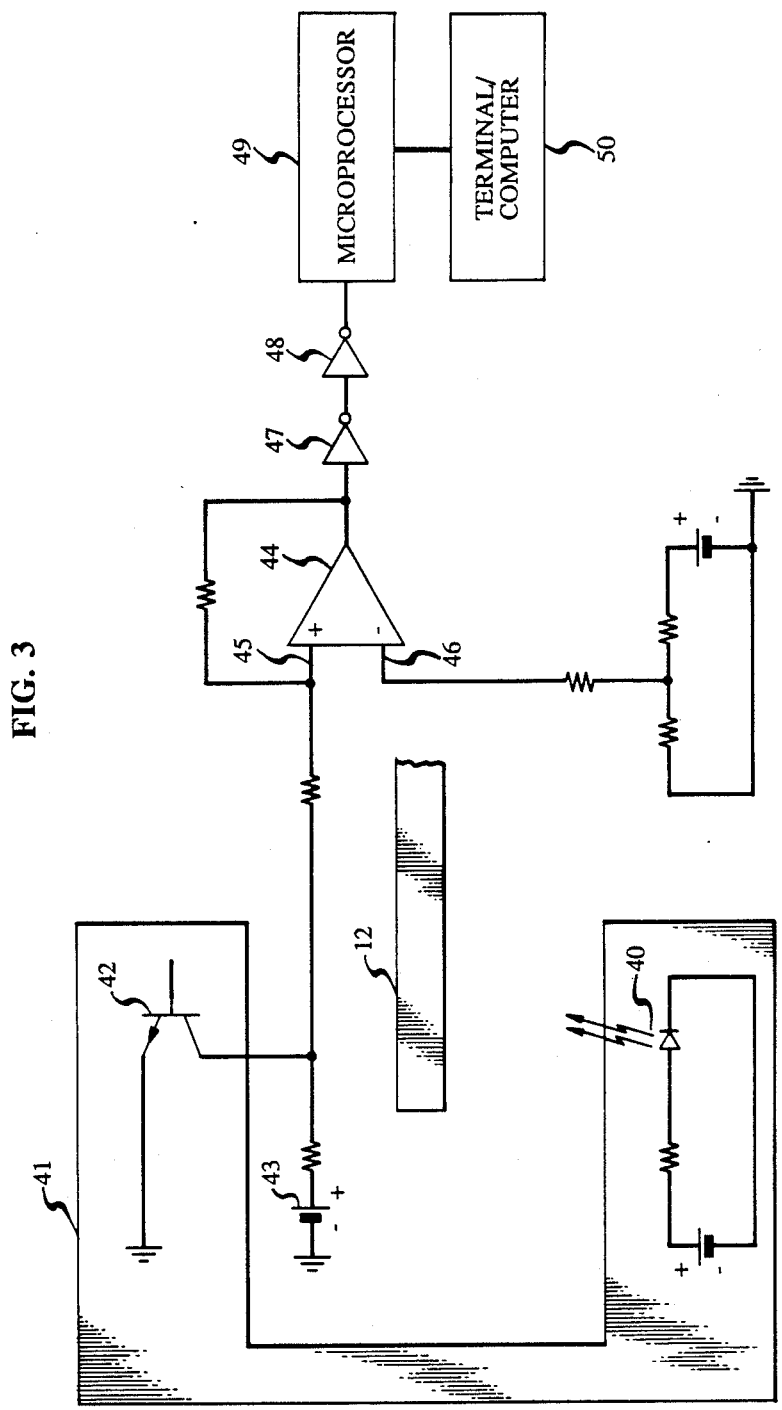
FIG. 3 is a more detailed illustration of a portion of the apparatus of FIG. 1 in accordance with an embodiment of the invention.

FIG. 3 illustrates schematically one form of optical means which can be used to access the information contained in the hole patterns. The apparatus includes a standard semiconductor light emitting diode (LED) 40 mounted within a frame 41 which extends around the conveying means (not shown) so that the LED is positioned below the workpieces, such as 12, between conveyor belts (see FIG. 1). (It will be appreciated that in the view of FIG. 3, the workpieces, such as 12, are moving into the plane of the drawing.) Also mounted within the frame, but at a position above the conveying means opposite to the LED is a standard semiconductor phototransistor 42. The LED and phototransistor are positioned so that the phototransistor will receive light from the LED when a hole in the hole pattern passes therebetween, and will receive no light when a space or other portion of the workpiece passes therebetween. The phototransistor will conduct an electrical signal from dc source 43 to ground whenever light from LED 40 is incident thereon. A thresholding circuit comprising an operational amplifier 44 is coupled to the phototransistor such that the positive input 45 of the amplifier is drawn lower than the potential of the negative input 46 when the phototransistor is conducting. When the potential of 45 is more negative than 46, a (negative) signal will be produced at the output of the amplifier, 44. The signal, which represents the presence of a hole in the printed circuit board, is coupled via inverter 47, and line driver 48, to the input of a microprocessor 49. The microprocessor decodes the pattern of holes according to a program stored in the EPROM (not shown) in the microprocessor and transmits the information to a terminal, 50, for display of the lot code and/or a computer which controls machinery, on the production line. The particular microprocessor employed was a standard 8-bit microprocessor sold by Motorola which included a parallel input port and a serial output port.

The microprocessor can be programmed to measure a certain number of holes and spaces, in this example, 16 holes and 13 spaces, since each digit will include three holes and three spaces, while the start will include four holes and one space. The presence or absence of holes is determined by timing of durations of light and dark by the microprocessor according to the photoreceiver signals. The microprocessor program will reject other holes such as 22 and 23 of FIG. 2, since their size and spacing is incompatible with the binary hole pattern. When a valid 29-bit code is recognized, the hole pattern is decoded according to the table above by the microprocessor and displayed on the terminal 50. If the hole pattern is scanned in the reverse direction, the microprocessor program will first reverse the pattern, then decode it.

Figure 4:
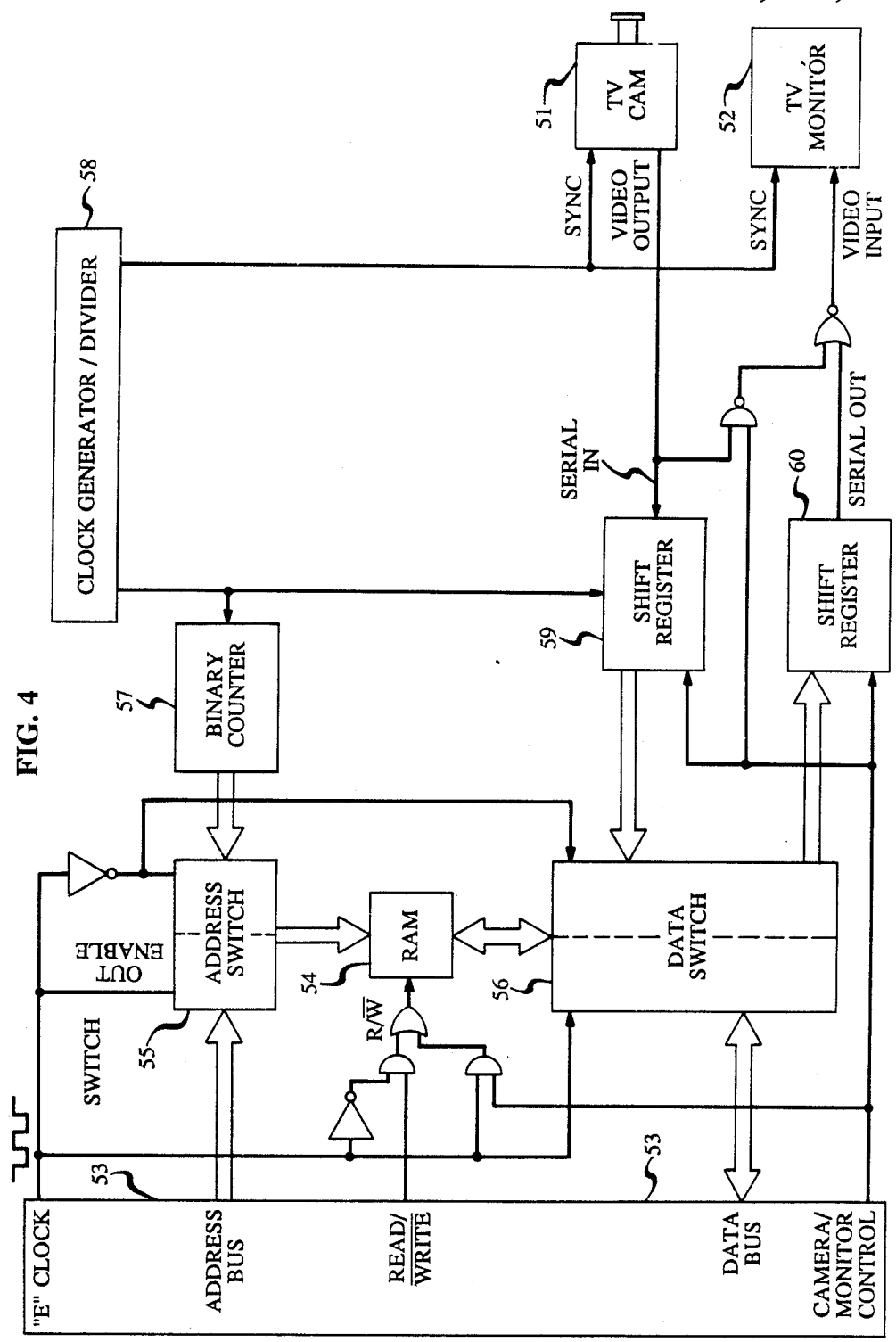
FIG. 4 is a more detailed illustration of essentially the same portion of the apparatus of FIG. 1 illustrated in FIG. 3 in accordance with an alternative embodiment of the invention.

In accordance with an alternative embodiment, the means for reading the hole pattern can comprise a video camera, 51 of FIG. 4, in place of a phototransistor, placed above the workpieces. A light source can be placed under the conveying means between wheels 6 and 17 as shown in FIG. 1. The camera can be, for example, a charge coupled device (CCD) array camera with a 16 mm lens which is placed approximately 11 inches above the conveying means. The hole patterns and the corresponding numerical information can be displayed on a standard TV monitor 52 as the workpieces pass beneath the camera.

The basic components for translating the hole pattern picked up by the camera into the numerical information displayed on the monitor are illustrated schematically in FIG. 4. The circuit includes a standard Motorola 6809 microprocessor 53, which is programmed to examine each scan of the camera in real time and decode the pattern by first examining all holes in the top third of the TV picture to find a pattern in a straight line. The line need not be horizontal to take into account possible tilting of the workpices as they pass the camera. Again, the program for decoding the pattern is stored in the EPROM (not shown) of the microprocessor. The interface between the microprocessor 53 and camera 51 provides a means for the microprocessor to read the data generated by the camera without having to keep up with the high speed scanning of the camera. The data from the camera is stored in a random access memory (RAM) illustrated as block 54. The microprocessor "E" clock will generate a pulse train of positive and negative portions coupled to an address switch illustrated as block 55. A negative pulse at the "output enable" portion of the switch will couple the microprocessor address bus to the RAM, 54, such that the data stored in the RAM is read out through data switch 56 and sent to the microprocessor data bus. The microprocessor can also input information into the RAM by means of a pulse from the read/write output.

A positive pulse from the "E" clock disconnects the microprocessor from the RAM and allows data from camera 51 to be written. Thus, during the positive pulse, a negative signal appears at the inverted input of the address switch to couple the binary counter 57 to the RAM through the address switch. The binary counter counts the clock signals from the clock generator/divider 58, which is coupled to the camera 51, in order to sequentially address the RAM.

In the meantime, the video signal from the camera 51 is coupled to the RAM, 54, through a serial in, parallel out shift register 59, controlled by the clock generator/divider 58, and through the data switch 56. Thus, portions of the video signal are put into the RAM during each positive portion of the pulse from the microprocessor "E" clock. During the same positive pulse portions, data from the RAM 54 may be read out through the data switch 56 and a second shift register 60 to the TV monitor 52. The display of the TV monitor is controlled by the microprocessor via the camera/monitor control port. The TV camera and the monitor are synchronized by a signal from the clock generator/divider.

The presence or absence of holes in this embodiment is determined by timing the duration of light and dark signals from the camera as in the previous embodiment and decoding according to the table.

Various additional modifications will become apparent to those skilled in the art. All such variations which basically rely on the teachings through which the invention has advanced the art are properly considered within scope of the invention.

What is claimed is:

1. A method of fabricating printed circuit board panels, including providing numerical information concerning said printed circuit board panels as they move along a conveying means, comprising the steps of
   drilling a pattern of holes in the printed circuit board panels, said pattern comprising a binary form of the numerical information; and
   optically addressing said information by means of a video camera as the printed circuit board panels move along the conveying means, the camera being coupled to a random access memory and a microprocessor also being coupled to the memory such that the information from the camera is written in the memory, and the microprocessor addresses the information, at alternate intervals.

2. The method according to claim 1 wherein the workpieces are printed circuit board panels.

3. The method according to claim 1 wherein the pattern comprises a linear array of holes and spaces such that each hole represents a "1", and each space represents a "0" in the binary code.

4. The method according to claim 3 wherein the hole pattern includes a parity and sync bit, represented by a hole or space, associated with each numeral.

5. Apparatus for fabricating printed circuit board panels, including providing numerical information concerning said printed circuit board panels as they move along a conveying means, comprising:

means for drilling a pattern of holes in the printed circuit board panels such that the pattern comprises the numerical information in binary form; and means for optically addressing the information as the printed circuit board panels move along the conveying means, the optical addressing means comprising a video camera, a random access memory, and a microprocessor where the camera and the microprocessor are coupled to the memory such that information is written into the memory, and said information is addressed by the microprocessor, at alternate intervals.

6. The apparatus according to claim 5 wherein the means for addressing the information includes optical means of determining the presence or absence of holes.

* * * * *